(12) United States Patent
Chen et al.

(10) Patent No.: US 7,279,962 B2
(45) Date of Patent: Oct. 9, 2007

(54) FREQUENCY TUNING LOOP FOR ACTIVE RC FILTERS

(75) Inventors: Hung-I Chen, Kaohsiung (TW); Chih-Hong Lou, I-Lan (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/919,233

(22) Filed: Aug. 17, 2004

(65) Prior Publication Data

US 2005/0242873 A1    Nov. 3, 2005

(30) Foreign Application Priority Data

Apr. 30, 2004   (TW) ............................. 93112278 A

(51) Int. Cl.
*H03K 5/00* (2006.01)
(52) U.S. Cl. ...................... 327/553; 327/552
(58) Field of Classification Search ........ 327/552–559; 330/305
See application file for complete search history.

(56) References Cited

U.S. PATENT DOCUMENTS

| | | | | |
|---|---|---|---|---|
| 5,187,445 A | * | 2/1993 | Jackson | ...................... 327/553 |
| 5,914,633 A | * | 6/1999 | Comino et al. | ............. 327/553 |
| 6,677,814 B2 | * | 1/2004 | Low et al. | .................. 327/554 |
| 6,710,644 B2 | * | 3/2004 | Duncan et al. | ............. 327/558 |
| 6,803,813 B1 | * | 10/2004 | Pham | ......................... 327/553 |
| 6,842,710 B1 | * | 1/2005 | Gehring et al. | ............. 702/107 |

* cited by examiner

*Primary Examiner*—Dinh T. Le
(74) *Attorney, Agent, or Firm*—Rosenberg, Klein & Lee

(57) ABSTRACT

A tuning loop which can tune the cut-off frequency of an active RC filter is disclosed. The cut-off frequency is determined by equivalent resistance and equivalent capacitance in an active RC filter, therefore, the tuning loop changes the equivalent resistance to tune the cut-off frequency. The time constant of the circuit is compared to see if it is equal to the applied preset time cycle after the equivalent resistance value is changed. The cut-off frequency of the filter is tuned to a preset value when the time constant in the circuit is equal to the applied preset time cycle, or the equivalent should be changed until the time constant equal to the applied preset time cycle. A precise result can be obtained after being tuned by tuning loop due to the each component of the tuning loop are operated in an environment which is equivalent to the active RC filter.

21 Claims, 4 Drawing Sheets

US 7,279,962 B2

FREQUENCY TUNING LOOP FOR ACTIVE RC FILTERS

BACKGROUND OF THE PRESENT INVENTION

1. Field of the Invention

The present invention relates to an analog filter circuit, and more particularly to a frequency tuning loop capable of continuously tuning and compensating the cut-off frequency of a filter.

2. Description of the Prior Art

A filter, which is common and the most important element in a typical signal process system, is configured to eliminate the unnecessary frequency signal for preserving or amplifying the required frequency signal (a filter generally refers to a component which allows/passes a range of frequencies and rejects all other frequencies from an input signal). The filter integrated into the chip is a trend in the development of integrated circuit process. However, many factors can not be properly controlled in integrated circuit process to maintain electrical elements at their perfect properties. Furthermore, the circuit integration may cause the unstable performance of the electrical elements according to the environment and time in use. For example, according to a portable communication product in rapid development, a set of circuit system may be applied in any environments to cause the cut-off frequency of filter aberrant from a preset value. Thus, it is an important key for the signal process of communication system to compensate and keep the cut-off frequency at a preset level.

The cut-off frequency of a filter is proportional to the reciprocal of time constant $\tau$ (i.e. $f = 1/2\pi\tau$) and the time constant $\tau$ is the product of equivalent resistance and capacitance (i.e. $\tau = R \times C$) of the active RC filter. Therefore, the cut-off frequency may be tuned to a preset value by efficiently controlling the equivalent resistance or equivalent capacitance in an active RC filter. Accordingly aforementioned, a tuning loop is added in the general RC filter for tuning the cut-off frequency back to the preset value by immediately tuning the equivalent resistance or equivalent capacitance in the filter, as soon as the original cut-off frequency of the filter is aberrant. FIG. 1 is a schematic diagram illustrating a known tuning loop. In general, input signal 112 is processed by the RC filter 110 and then output signal 114 outputs from the RC filter 110. As soon as the time constant of the RC filter 110 is aberrant from a preset value (compared through the line 122) and detected by the tuning loop 120, a tuning signal is generated from line 124. Then, the equivalent resistance or equivalent capacitance in the RC filter 110 is tuned for making the cut-off frequency back to the original setting.

FIG. 2A is the typical circuit of a tuning loop with a resistor $R_{22}$ and a capacitor $C_{22}$ as the equivalent resistor and equivalent capacitor in the filter. When the constant current sources $I_{22}$, $I_{24}$ with a constant current ratio are respectively through the resistor $R_{22}$ and capacitor $C_{22}$, a voltage $V_{22}$ is generated across the resistor $R_{22}$, while the voltage $V_{24}$ of the capacitor $C_{22}$ will increase in accordance with the charging of the capacitor $C_{22}$ shown in FIG. 2B. When the constant current source begins charging to the capacitor $C_{22}$, the pulse comparator 220 starts count at the same time; and then stops after reaching a preset time cycle. The preset time cycle is a reference value of time constant. The voltage comparator 210 checks whether voltage $V_{24}$ is greater than voltage $V_{22}$ at the moment of stopping counting by the pulse comparator 220. The result acquired by the voltage comparator 210 can be used to decide either increase or decrease the value of capacitor $C_{22}$ by the tuning loop 230, as well as the charge time of capacitor $C_{22}$. The tuning loop would repeat the aforementioned process to make the charge time of voltage $V_{22}$ on the capacitor $C_{22}$ equal the preset time cycle. Finally, the equivalent capacitance of tuning loop is equal the one of the capacitor $C_{22}$.

In FIG. 2A, both the resistor $R_{22}$ and capacitor $C_{22}$ are grounded at one end respectively. However, it is not the situation in a practical filter circuit. Thus, the equivalent resistance and capacitance in the real filter circuit are different from the ones in FIG. 2A. Therefore, it is necessary to design one having the cut-off frequency of the tuning loop equal the real filter circuit under the accuracy requirement.

SUMMARY OF THE INVENTION

Accordingly, one of objects of the invention provides a frequency tuning loop which is operatable under a practical environment or real condition. It can compensate and prevent frequency shift caused by process or environment.

It is another object of the present invention to provide one or more variable resistors to tune the time constant of the filter circuit by changing the equivalent resistance.

It is yet another object of the present invention to provide a time constant comparison and tuning device, which determine whether the time constant of the filter circuit is equal to a preset time, and tune the equivalent resistance according to a compared result.

DESCRIPTION OF THE PREFERRED EMBODIMENT

The circuit structure of the present invention is described below, but not including the complete circuit structure of the frequency tuning loop for active resistive-capacitive filer. In order to describe the present invention more easy, the prior art introduced in the present invention are cited centrally. The related drawings in the below just for displaying the feature structure of the present invention are not drawn in proportion to the real cases.

Figure 1:
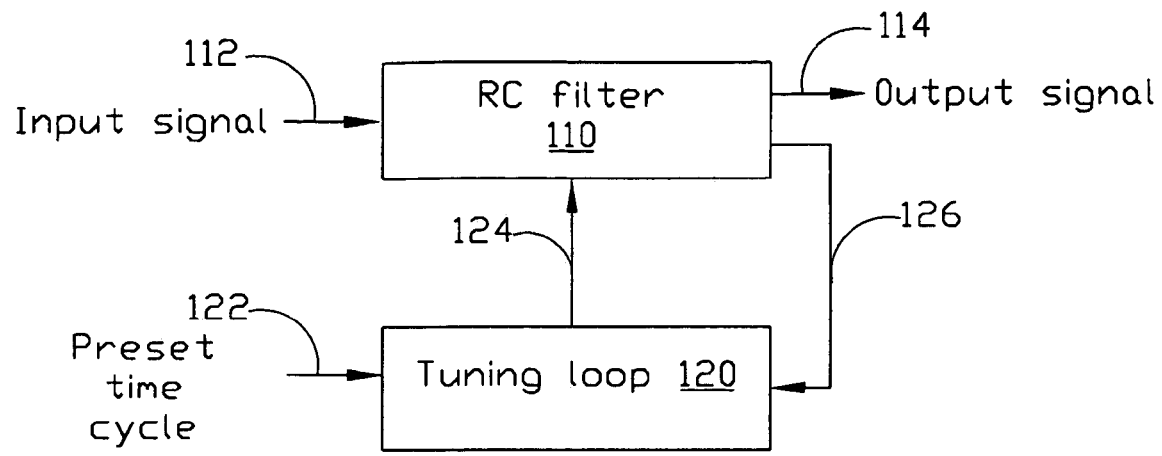
FIG. 1 is a schematic diagram illustrating a known tuning loop.
Figure 2A:
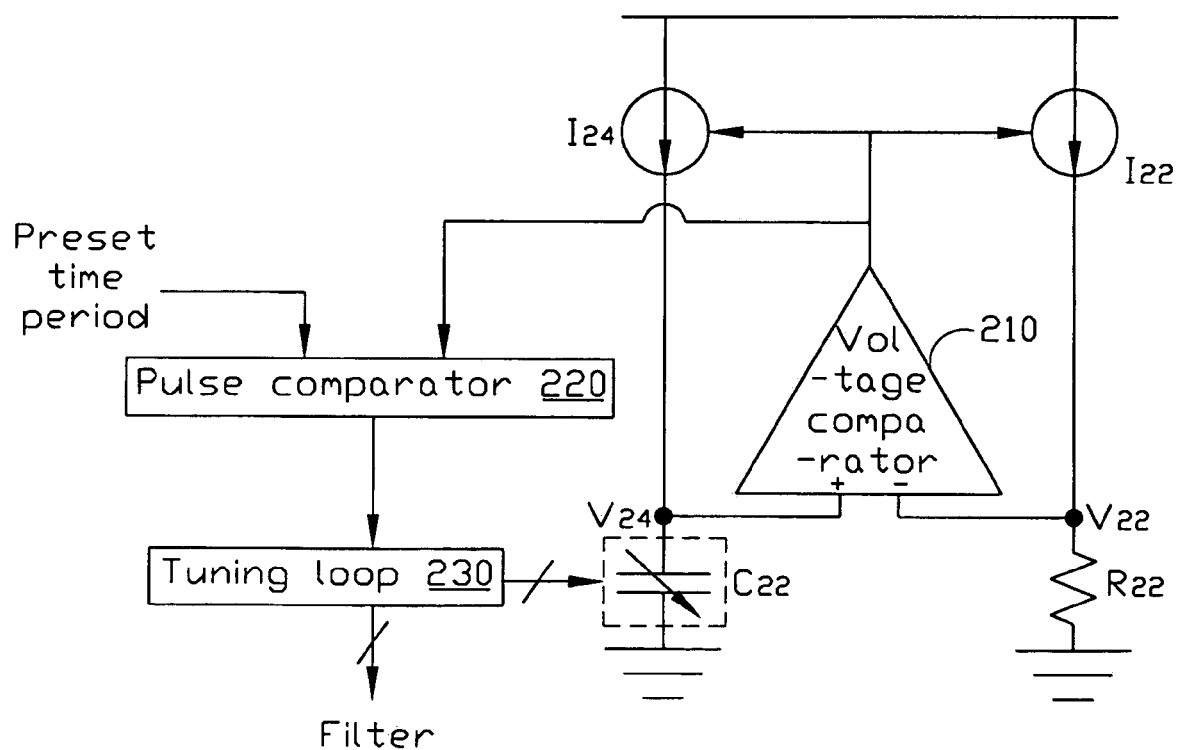
FIG. 2A is the typical circuit diagram of a tuning loop.
Figure 2B:
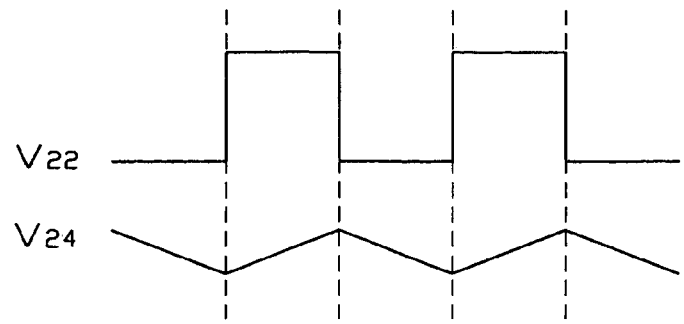
FIG. 2B shows the relationship between the input terminal voltages in the voltage comparator of the typical tuning loop.
Figure 3A:
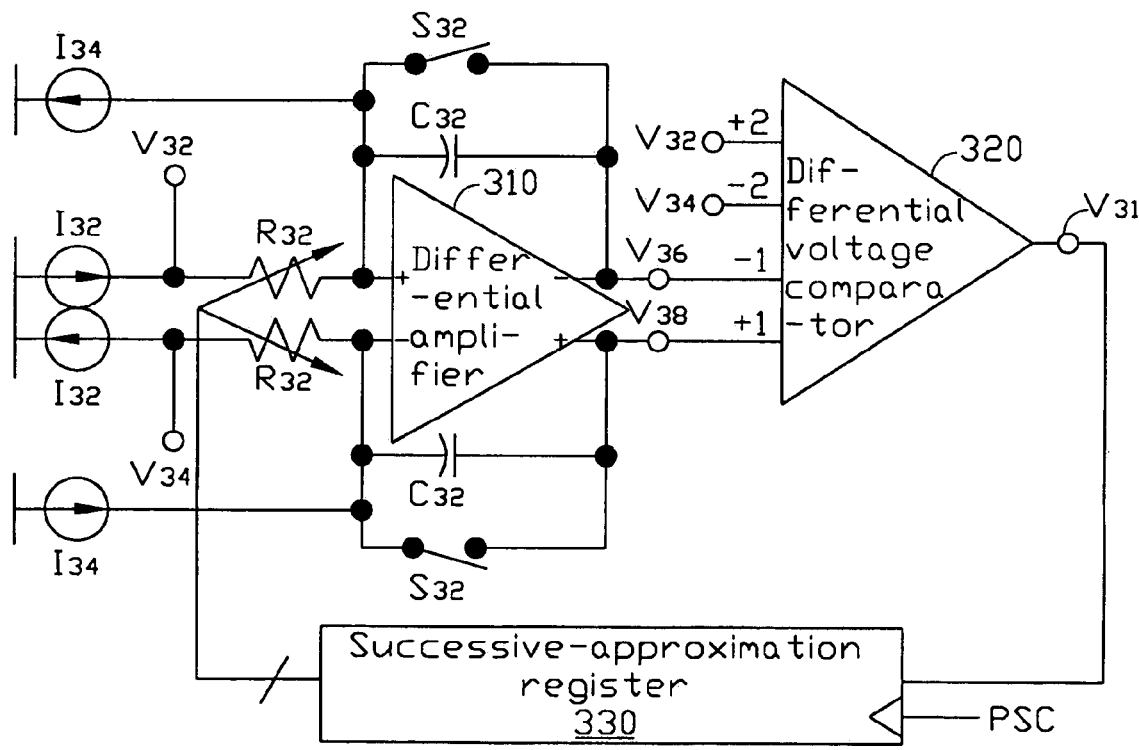
FIG. 3A is one of the preferred embodiments illustrating the frequency tuning loop circuit in accordance with the present invention.

FIG. 3A is one of the preferred embodiments illustrating the frequency tuning loop circuit in accordance with the present invention. A filter circuit, such as an active RC filter circuit, is composed of a dual-input/dual-output differential amplifier 310, two feedback capacitors $C_{32}$ and two variable resistors $R_{32}$. The variable resistors $R_{32}$ can be implemented by any prior art, for instance, by applying a resistor selective circuit consisting of the same cells of resistors and switches in parallel or series. In addition, a differential voltage comparator 320 is used to determine a value of output voltage and, while in the transition period of the output voltage (for example, form a high state to a low state), acquire a corresponding time constant from a comparing/adjusting signal device (such as a successive-approximation register, SAR). Then, a successive-approximation register 330 appropriately tunes the variable resistor $R_{32}$ in accordance with the comparison result between the time constant and the preset circle PSC.

Figure 3B:
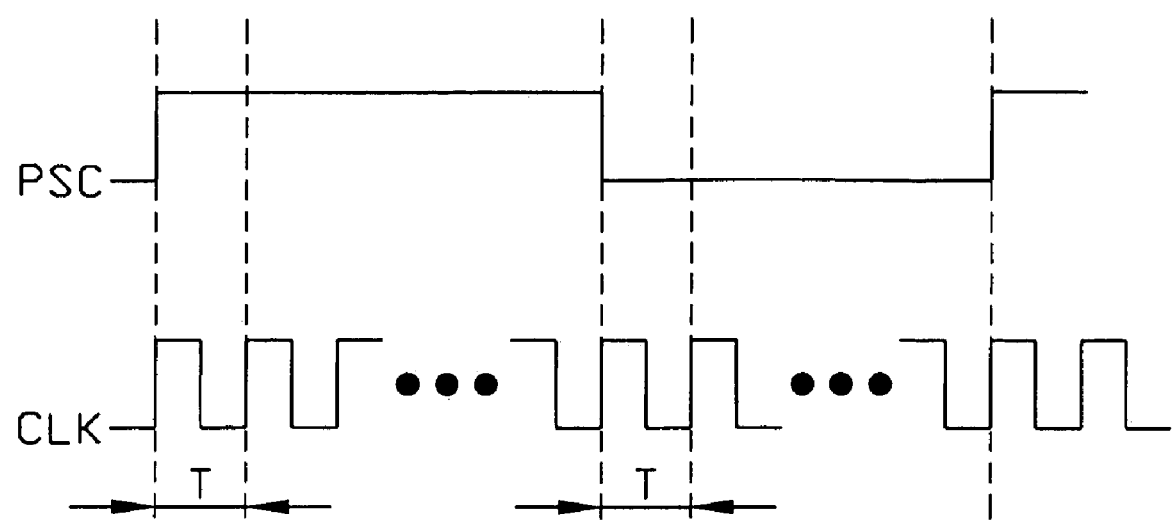
FIG. 3B is a schematic diagram illustrating the preset circle PSC.

The generation of the preset circle PSC is shown in FIG. 3B. When the time cycle of the external system time clock CLK is "T", the enable duration of the preset circle PSC, as well as the disable duration thereof for resetting frequency tuning loop, is designed as a multiple of "T" and further in constant proportion to the preset time constant of a filter circuit. On the other hand, the preset circle PSC controls the on and off states of the switch devices $S_{32}$ shown in FIG. 3A. The switch device $S_{32}$ is off on condition that the preset circle (PSC) is enabling, or on, reversely.

In analysis of the frequency tuning loop in FIG. 3A, first, the currents provided by the constant current sources $I_{34}$ are 0, as well as ones in the opening state. At the moment, the feedback capacitors $C_{32}$ are charged only by the currents that are provided by the constant current sources $I_{32}$ and flow through the variable resistors $R_{32}$. The frequency tuning loop starts to operate on condition that the preset circle PSC starts to enable at the moment of switch devices $S_{32}$ on the off state. According to the operation characters of the differential amplifier, the voltage difference between the non-inverting and inverting terminals is assumed 0, namely, it is on the state of virtual short between the non-inverting and inverting terminals, so as to generate two positive voltages $V_{32}$, $V_{38}$ and two negative voltages $V_{34}$, $V_{36}$. For the symmetry on upper half and down half of the circuit, for instance the upper half circuit, the value of the voltage $V_{32}$ and the voltage $V_{36}$ are respectively:

$$V_{32}=I_{32}\times R_{32}$$

$$V_{36}=(I_{32}/C_{32})\times t$$

wherein t is the duration after PSC is enabling. Accordingly, "t" is equal to the multiple of $R_{32}$ and $C_{32}$ when $V_{32}$ is equal to $V_{36}$. That is, the time "t", the time constant of the circuit, indicates the duration for charging from zero bridging voltage of the capacitor $C_{32}$ to a level equal to the one of the variable resistor $R_{32}$. The time "t" on successive-approximation register 330 is acquired by transferring the output voltage of the differential voltage comparator 320.

The voltage comparison in the differential voltage comparator 320 is implemented by a result through the operation: $(V_{38}-V_{36})-(V_{32}-V_{34})$. The result less than 0 volt indicates the bridging voltage of the capacitor $C_{32}$ is below the one of the resistor $R_{32}$. At the moment, the voltage $V_{31}$ outputs a "0" level voltage potential, such as 0 volt. Reversely, the result more than 0 volt indicates the bridging voltage of the capacitor $C_{32}$ reaches to or over the one of the resistor $R_{32}$. At the moment, the voltage $V_{31}$ outputs a "1" level voltage potential, such as 5 volts.

When the circuit persistently operates to the moment of the preset circle PSC is disabling, the successive-approximation register 330 judges dependent on the level of the voltage $V_{31}$. The level "0" of the voltage $V_{31}$ indicates the current time constant of the circuit is more than the preset value. Thus, the level of the voltage $V_{32}$ is reduced with tuning the resistance of the variable resistor $R_{32}$ down. Furthermore, the charging time from the level of the capacitor $C_{32}$ to the level of the voltage $V_{32}$ is also shortened. On the contrary, the level "1" of the voltage $V_{31}$ indicates the current time constant of the circuit is less than the preset value. Thus, the level of the voltage $V_{32}$ is raised with tuning the resistance of the variable resistor $R_{32}$ up. Furthermore, the charging time from the level of the capacitor $C_{32}$ to the level of the voltage $V_{32}$ is also lengthened. At the same time, each switch device $S_{32}$ is also set "on" state to provide the capacitor $C_{32}$ a discharging route for resetting the current. It is noted that when switch device $S_{32}$ is "on", the resistance is so low enough to be neglected for the sake of ensuring a low initial resistance derived from the product of the resistance and the current $I_{32}$ being generated on the capacitor $C_{32}$. When the preset time cycle is enabled again, the frequency tuning loop will repeat the above-mentioned procedure again until the time constant of the circuit is completely coincided with or closely reaches to the enable duration of the preset circle PSC. At the moment, the equivalent resistance value of the main circuit on the filter can be regulated according to the result.

The trend for regulating the resistors may be dependent on either the constant charging time of a capacitor aforementioned or a variable one thereof. In an alternative embodiment with variable charging time, the capacitor $C_{32}$ has not stopped charging until the output voltage of the differential voltage comparator 320 reaching the transfer state, and then the system time clock CLK period responding to the charging time is acquired with the successive-approximation register 330. When the system time clock CLK period is larger than the preset time constant, the resistance value should be tuned down, or tuned up reversely. In such a trend, the bigger error on the time constant results from the enable duration of the preset cycle PSC not only the integer multiple of the system time CLK period in application but also the definition of the so-called the constant time of the filer, when the frequency of the system CLK is not high enough. At this moment, if the constant current source $I_{34}$ is applied into the circuit and supposed to have a value in a proportion "a" to the value of the constant current source $I_{32}$, such as half of the current value of the constant current source $I_{32}$ for current of the constant current source $I_{34}$, the constant current source $I_{34}$ has a shunt effect for the constant current source $I_{32}$. In other words, the current flowing through the capacitor $C_{32}$ is reduced, but the charging time of the capacitor $C_{32}$ is increased however. At the moment, the time constant becomes to:

$$I_{32}\times R_{32}=(a\times I_{32}/C_{32})\times t$$

when a=0.5, $$t=2\times R_{32}\times C_{32}$$

Figure 4:
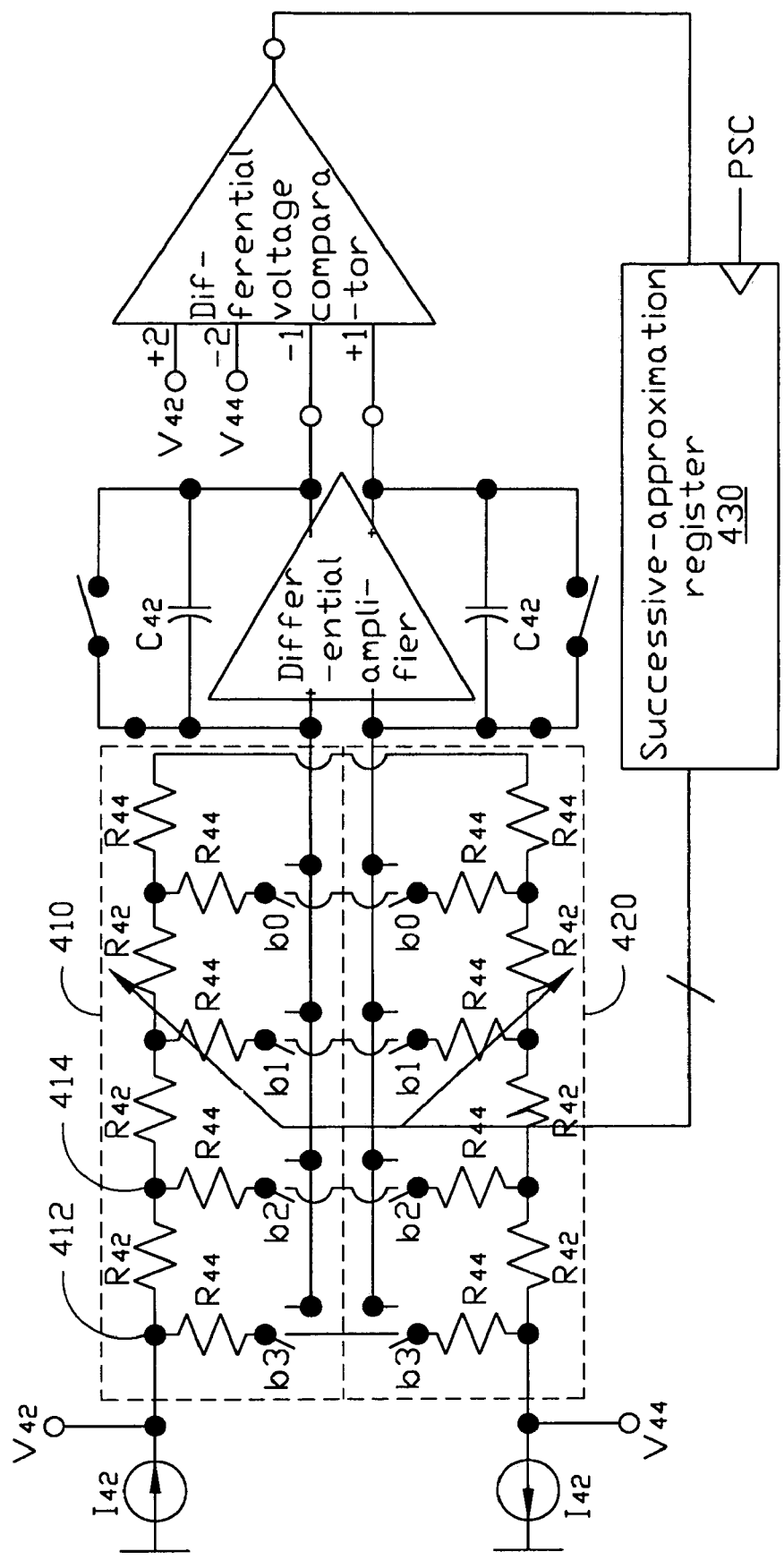
FIG. 4 is another preferred embodiment of the present invention.

From above, the larger the current value of the constant current source $I_{34}$ is, the longer the time t is necessary, such that the error caused form above-mentioned problems will be reduced. The controllable shunt devices of the circuit in the present invention could be consisted of one or more resistor ladder circuits, the series selective resistance circuits or the parallel selective resistance circuits. In the embodiment, the resistor ladder circuits are especially more suitable for implementing the circuit configuration of the active AC filter. However, the equivalent resistance in the controllable shunt device of the invention could be controlled by one or more digital control signals. FIG. 4 is another preferred embodiment of the present invention. The configuration of the 4-level R-R2 resistance ladders basically includes the controllable shunt devices 410 and 420 in which the resistive value of the resistor $R_{44}$ is double of the one of the resistor $R_{42}$, and the interior switch devices b3, b2, b1 and b0 control the flowing direction of the current, respectively. The currents are directed to the controllable shunt devices 410 and 420 by each switch device would be illustrated by the following paragraph.

Further, the R-2R resistance ladder is applied in the embodiment of the present invention. Its property and basic principle are well known and need not be described herein.

It could be known from the basic principle of the R-2R resistor ladder, after the current $I_{42}$ flows inwards the node 412 of the R-2R resistor ladder 410, the current $I_{42}$ is divided equally into two currents $I_{42}/2$, which one flows into the node 414 and the other into the switch device b3. On this account, there will be four currents $I_{42}/2$, $I_{42}/4$, $I_{42}/8$ and $I_{42}/16$ flowing respectively through the switch devices b3, b2, b1 and b0. The on/off states of the switch devices b3, b2, b1 and b0 can be used individually to determine whether those currents charge the capacitor 42. For example, when only the switch device b3 is "on" and the others are "off", the current $I_{42}/2$ will charge the capacitor $C_{42}$. But when the switch device b1 is also "on", the current $(I_{42}/2)+(I_{42}/8)$ will charge the capacitor $C_{42}$. Thus, the charging current will increase and the time constant will decrease naturally. Such that, the successive-approximation register 430 only directly control the switch devices b3, b2, b1 and b0 of the R-2R resistor ladder for the achievement on adjusting the time constant. Therefore, the time constant could be more fine-tuned with the character of the R-2R resistor ladder. Equivalently, this current configuration can control the charging current magnitude of the capacitor $C_{32}$, which is known as a binary-weighted control relation from the indication of the current value in the drawings.

The above-mentions are only the preferred embodiments of the present invention, not intended to limit the scope thereof. It will be appreciated and carried out by those professions skilled in the art. Thus, many modifications of the embodiments which can be made without departing from the spirit of the present invention should be covered by the following claims.

What is claimed is:

1. A tuning loop for tuning a frequency of an active RC filter, said tuning loop comprising:
   a differential amplifier having an inverting input terminal, a non-inverting input terminal, an inverting output terminal, and a non-inverting output terminal;
   a first current source having an inverting terminal and a non-inverting terminal;
   two variable resistances each having a first and a second terminals, wherein said two first terminals are respectively electrically coupled to said non-inverting and said inverting input terminals of said differential amplifier and said two second terminals are respectively electrically coupled to said non-inverting and said inverting terminals of said first current source;
   two capacitors each having a first and a second terminals, wherein said two first terminals are respectively electrically coupled to said non-inverting and said inverting input terminals of said differential amplifier and said two second terminals are respectively electrically coupled to said non-inverting and said inverting output terminals of said differential amplifier;
   two switches each having a first and a second terminals, wherein said two first terminals are respectively electrically coupled to said first terminals of said two capacitors and said two second terminals are respectively electrically coupled to said two second terminals of said two capacitors;
   a comparative device having a first, a second, a third, and a fourth input terminals and an output terminal, wherein said first input terminal of said comparative device is electrically coupled to said non-inverting terminal of said first current source, said second input terminal of said comparative device coupled to said inverting terminal of said first current source, said third input terminal of said comparative device coupled to said inverting output terminal of said differential amplifier and said fourth input terminal of said comparative device coupled to said non-inverting output terminal of said differential amplifier;
   an applied preset time configured for driving said two switches; and
   a signal comparative tuning device for comparing said applied preset time cycle with a time constant corresponding to an output signal in transition state from said comparative device and tuning resistances of said two variable resistors.

2. The tuning loop of claim 1, wherein said first current source is a constant current source.

3. The tuning loop of claim 1, further comprising a second current source having a non-inverting and an inverting terminals, wherein said non-inverting terminals of said second current source is electrically coupled to said inverting input terminal of said differential amplifier and said inverting terminal of said second current source coupled to said non-inverting input terminal of said differential amplifier.

4. The tuning loop of claim 3, wherein said second current source is a constant current source.

5. The tuning loop of claim 3, wherein a current of said first current source is proportional to a current of said second current source.

6. The tuning loop of claim 1, wherein said two variable resistors consist of a parallel resistive selective circuit.

7. The tuning loop of claim 1, wherein said two variable resistors comprise a series resistive selective circuit.

8. The tuning loop of claim 1, wherein said two variable resistors consist of a configuration of a resistor ladder circuit.

9. The tuning loop of claim 1, wherein said comparative device is a differential voltage comparator.

10. The tuning loop of claim 1, wherein said signal comparative tuning device comprises a successive-approximation register circuit.

11. The tuning loop of claim 10, wherein said successive-approximation register circuit synchronously controls said two variable resistors.

12. A method for tuning a cut-off frequency of an active RC filter, said active RC filter comprising a differential amplifier, a couple of controllable shunts and a couple of feedback capacitors, said differential amplifier having a couple of input terminals and a couple of output terminals, said method comprising:
   providing a comparative device comprising four input terminals and an output terminal, said four input terminals electrically connecting to said couple of input and output terminals of said differential amplifier;
   providing a clock; and
   tuning resistance of said controllable shunt according to an output voltage level of said output terminal of said comparative device at a specific moment when said clock transits between high and low levels;

wherein said output voltage level indicates a comparison result of voltage levels at said four input terminals which are respectively connected to said couple of controllable shunts and said couple of feedback capacitors such that said cut-off frequency can be represented as a function of a product of said resistance and capacitance of said feedbck capacitor.

13. The method of claim 12, wherein said controllable shunt comprises a parallel resistive selective circuit.

14. The method of claim 12, wherein said controllable shunt is a series resistive selective circuit.

15. The method of claim 12, wherein said controllable shunt is a configuration of a resistor ladder circuit.

16. The method of claim 12, wherein said resistance of said controllable shunt is tuned by digital control signals.

17. The method of claim 12, wherein said comparative device is a differential voltage comparator.

18. The method of claim 16, wherein said digital control signals is generated from a successive-approximation register circuit receiving said clock and said output terminal as inputs.

19. The method of claim 12, wherein said resistance of said controllable shunt is tuned to decrease if said output voltage level is in high state at said specific moment.

20. The method of claim 12, wherein said resistance of said controllable shunt is tuned to increase if said output voltage level is in low state at said specific moment.

21. The method of claim 12, wherein period of said clock is a multiple of period of a system clock for said active RC filter.

* * * * *